(12) United States Patent
Loopstra et al.

(10) Patent No.: US 7,724,351 B2
(45) Date of Patent: May 25, 2010

(54) LITHOGRAPHIC APPARATUS, DEVICE MANUFACTURING METHOD AND EXCHANGEABLE OPTICAL ELEMENT

(75) Inventors: Erik Roelof Loopstra, Heeze (NL); Adrianus Franciscus Petrus Engelen, Waalre (NL); Bernardus Antonius Johannes Luttikhuis, Nuenen (NL); Maria Johanna Agnes Rubingh, Eindhoven (NL); Johannes Martinus Andreas Hazenberg, Wijchen (NL); Laurentius Catrinus Jorritsma, Helmond (NL); Johannes Wilhelmus De Klerk, Eindhoven (NL); Bernhard Geuppert, Aalen (DE); Aart Adrianus Van Beuzekom, Eindhoven (NL); Petrus Franciscus Wilhelmus Maria Mandigers, Valkenswaard (NL); Franz Sorg, Aalen (DE); Peter Deufel, Königsbronn (DE); Peter Schaap, Eindhoven (NL)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 732 days.

(21) Appl. No.: 11/341,894

(22) Filed: Jan. 30, 2006

(65) Prior Publication Data
US 2007/0177122 A1 Aug. 2, 2007

(51) Int. Cl.
*G03B 27/54* (2006.01)
*G03B 27/72* (2006.01)
*G03B 27/52* (2006.01)

(52) U.S. Cl. ............................. 355/67; 355/71; 355/63
(58) Field of Classification Search .................. 355/55, 355/53, 67, 30, 77, 69, 63, 71; 359/820
See application file for complete search history.

(56) References Cited

U.S. PATENT DOCUMENTS

| 2001/0026355 | A1 | 10/2001 | Aoki et al. | |
| 2003/0025893 | A1 | 2/2003 | Nishi | |
| 2004/0008328 | A1* | 1/2004 | Akagawa et al. | 355/30 |
| 2005/0199598 | A1* | 9/2005 | Hunter et al. | 219/121.72 |

FOREIGN PATENT DOCUMENTS

| EP | 0 969 327 A2 | 1/2000 |
| EP | 0 969 327 A3 | 10/2002 |
| JP | 5-234850 | 9/1993 |
| JP | 6-177007 | 6/1994 |
| WO | 01/73825 A1 | 10/2001 |
| WO | WO2005/050322 A1 | 6/2005 |
| WO | WO2005/050323 A1 | 6/2005 |
| WO | 2006/069755 | 7/2006 |

OTHER PUBLICATIONS

European Search Report for Appl. No. 072501497-1226 dated May 24, 2007.
Written Opinion issued on Nov. 21, 2008 in Singapore Applicaiton No. 200700650-5.

* cited by examiner

*Primary Examiner*—Peter B Kim
(74) *Attorney, Agent, or Firm*—Pillsbury Winthrop Shaw Pittman LLP

(57) ABSTRACT

A lithographic apparatus has an assembly to exchange optical elements in a pupil plane of its projection system. The optical elements may be pupil filters and may conform to the physical dimensions specified for a reticle standard, e.g. having sides substantially equal to 5, 6 or 9 inches.

34 Claims, 9 Drawing Sheets

LITHOGRAPHIC APPARATUS, DEVICE MANUFACTURING METHOD AND EXCHANGEABLE OPTICAL ELEMENT

FIELD

The present invention relates to a lithographic apparatus and to device manufacturing methods using lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Efforts to keep up with the well-known Moore's law, which aims that the density of components in an integrated circuit should quadruple every three years, drive continual improvements in lithographic apparatus. The critical dimension of features that can be printed using a lithographic apparatus is proportional to the wavelength of the exposure radiation used divided by the numeric aperture (NA) of the projection system of the apparatus. Therefore there is a trend to provide projection systems with ever increasing numeric aperture. However, as the numeric aperture of the projection system increases, so does its size and complexity. Also, the depth of focus (DOF) is reduced, making imaging harder, particularly of difficult patterns such as contact hole arrays.

SUMMARY

It is therefore desirable to provide lithographic apparatus with improved imaging capabilities.

According to an embodiment of the invention, there is provided a lithographic projection apparatus including a projection system arranged to project an image of pattern onto a substrate, the projection system including a plurality of optical elements forming an optical system arranged to project a beam of radiation along an optical path including at least one pupil plane, and a transport mechanism arranged to move an exchangeable optical element into and out of the optical path in the or a pupil plane of the optical system.

According to an embodiment of the invention, there is provided a lithographic projection apparatus including a projection system arranged to project an image of a pattern onto a substrate, the projection system comprising a plurality of optical elements that form an optical system configured to project a beam of radiation along an optical path including a pupil plane, and a transport mechanism arranged to move an exchangeable optical element that has peripheral dimensions that substantially match relevant parts of a standard for patterning devices into and out of the optical path in the pupil plane of the optical system.

According to an embodiment of the invention, there is provided a device manufacturing method using a lithographic projection apparatus which has a patterning device and a projection system having at least one pupil plane arranged to project an image of the patterning device onto a substrate, the method including loading a pattern onto the patterning device; positioning an exchangeable optical element in the or a pupil plane; projecting an image of the pattern onto a substrate; removing the pattern from the patterning device; and removing the exchangeable optical element from the pupil plane.

According to an embodiment of the invention, there is provided a device manufacturing method using a lithographic projection apparatus that includes a pattern support to support a patterning device and a projection system having a pupil plane and arranged to project an image of a pattern of the patterning device onto a substrate, the method including loading the patterning device onto the pattern support; positioning an exchangeable optical element in the pupil plane; projecting an image of the pattern onto the substrate; removing the patterning device from the pattern support; and removing the exchangeable optical element from the pupil plane wherein the exchangeable optical element has peripheral dimensions that substantially match relevant parts of a standard for patterning devices According to an embodiment of the invention, there is provided an exchangeable optical element arranged to be selectively positioned in the pupil plane of the projection system of a lithographic apparatus, the exchangeable optical element having external dimensions meeting relevant parts of a standard for reticles.

According to an embodiment of the invention, there is provided an exchangeable optical element arranged to be selectively positioned in the pupil plane of the projection system of a lithographic apparatus, the exchangeable optical element not being rotationally symmetric.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
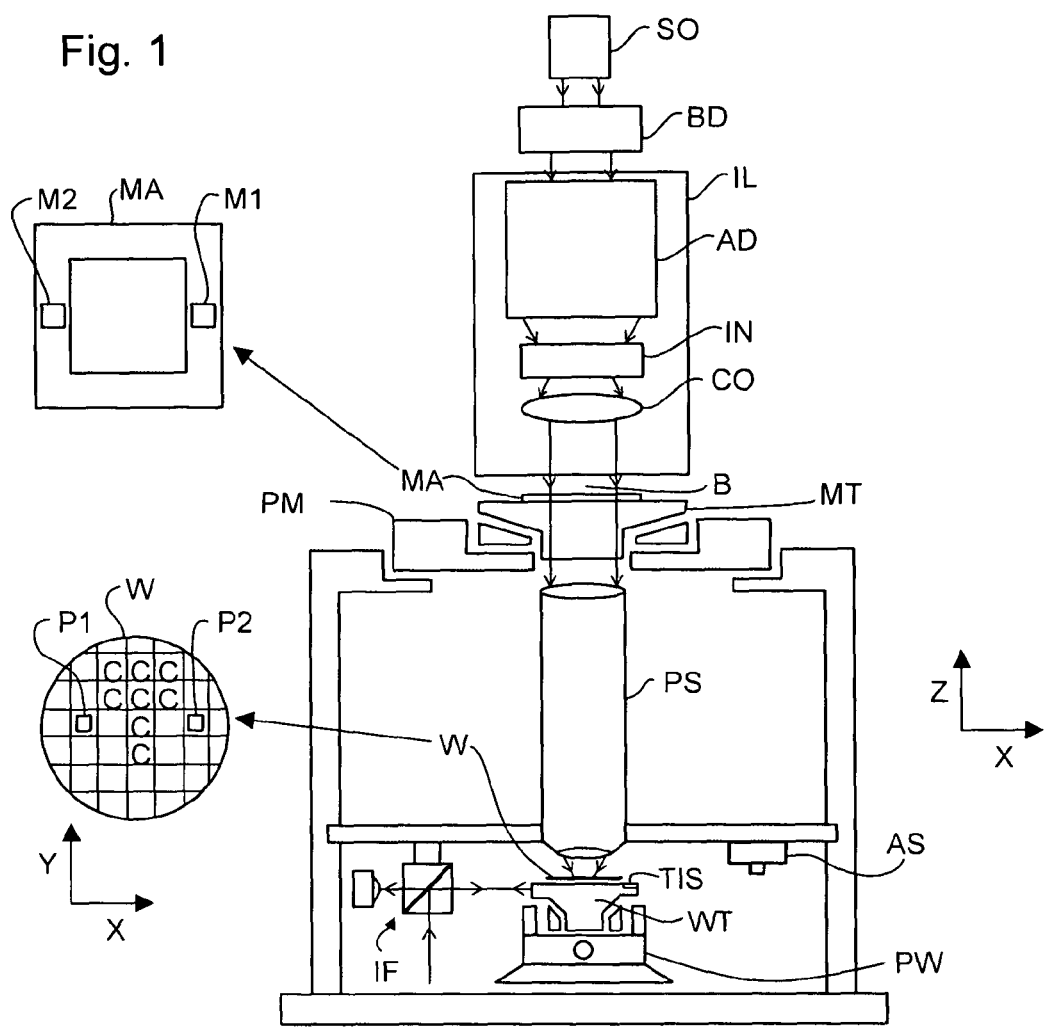
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation), a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation. The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment markers M1, M2 and substrate alignment markers P1, P2. Although the substrate alignment markers as illustrated occupy dedicated target portions, they may be located in spaces between target portions (these are known as scribe-lane alignment markers). Similarly, in situations in which more than one die is provided on the mask MA, the mask alignment markers may be located between the dies.

The depicted apparatus could be used in at least one of the following modes:

In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
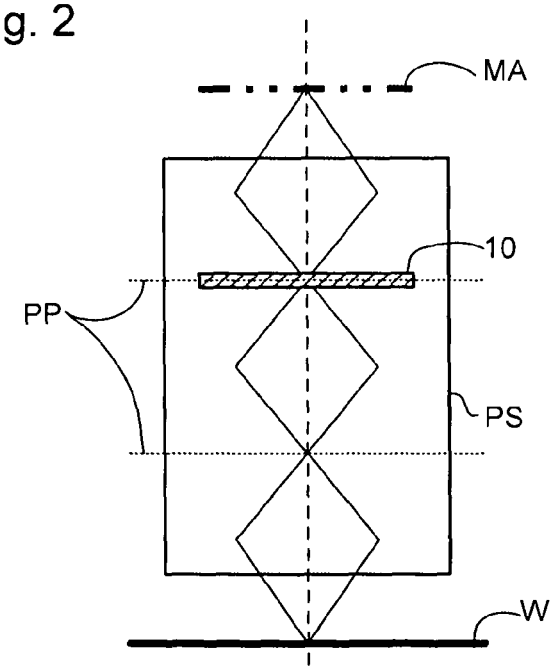
FIG. 2 depicts the projection system of the apparatus of FIG. 1.

As shown in FIG. 2, projection system PS has one or more planes PP that are Fourier conjugates of the object plane, where the patterning device MA is located, and the image plane, where the substrate W is located. Such planes are known as pupil planes. It is possible to improve usefully the projected image by placing an optical element in the pupil plane, for example by placing a filter in the pupil plane to block or attenuate the zeroth order of the radiation diffracted by the pattern, image contrast can be improved. However, the form of the element, e.g. filter, required to give a useful improvement in image quality will depend on the pattern being projected, and/or the illumination settings employed. For example, the size and position of the zeroth order will vary with the pitch of lines in pattern and the position of any off-axis poles in the illumination distribution.

To make use of the possibilities of placing elements in the pupil planes it is therefore desirable to be able to change element in the pupil plane whenever the pattern being imaged and/or illumination settings being used are changed. However, existing projection system are substantially complex and sensitive to contamination. Accordingly, they are contained in closed housings, generally supplied with a small overpressure, e.g. 3 mbar, of clean flushing gas, e.g. $N_2$. Some projection systems have elements that may be exchanged a few, e.g. four times during the life of the projection system to compensate for lens aging. In order to exchange such elements, the housing of the projection system is opened and these elements are carried out under generally extremely strict clean room conditions by skilled personnel. It is undesirable to carry this operation out more frequently than mandated because of the risk of contaminating the elements of the projection system and the time taken to perform the operation.

In an embodiment of the invention, transport mechanism 30 is provided to enable exchange of an optical element 10 in a pupil plane PP of the projection system, without opening the housing 20 of the projection system. This is shown in more detail in FIGS. 3 to 8.

Figure 3:
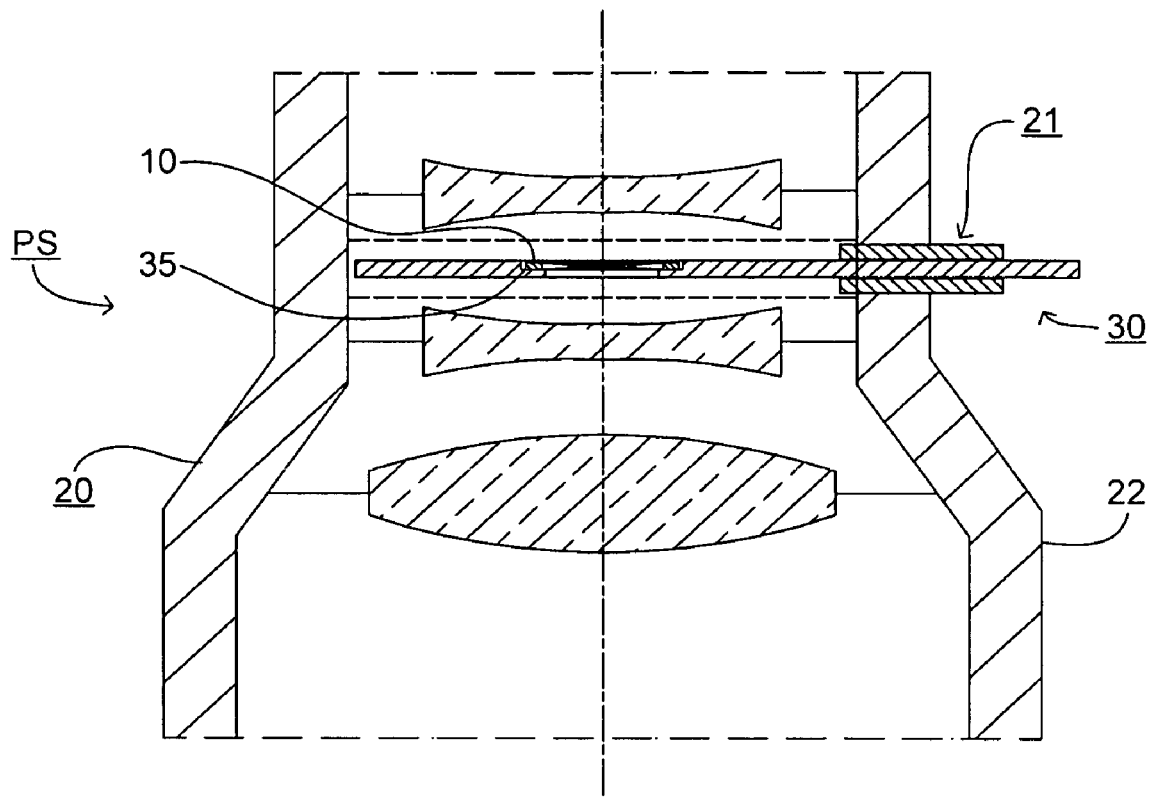
FIG. 3 is a side cross-sectional view of a part of the projection system of the apparatus of FIG. 1 showing the exchangeable optical element.
Figure 4:
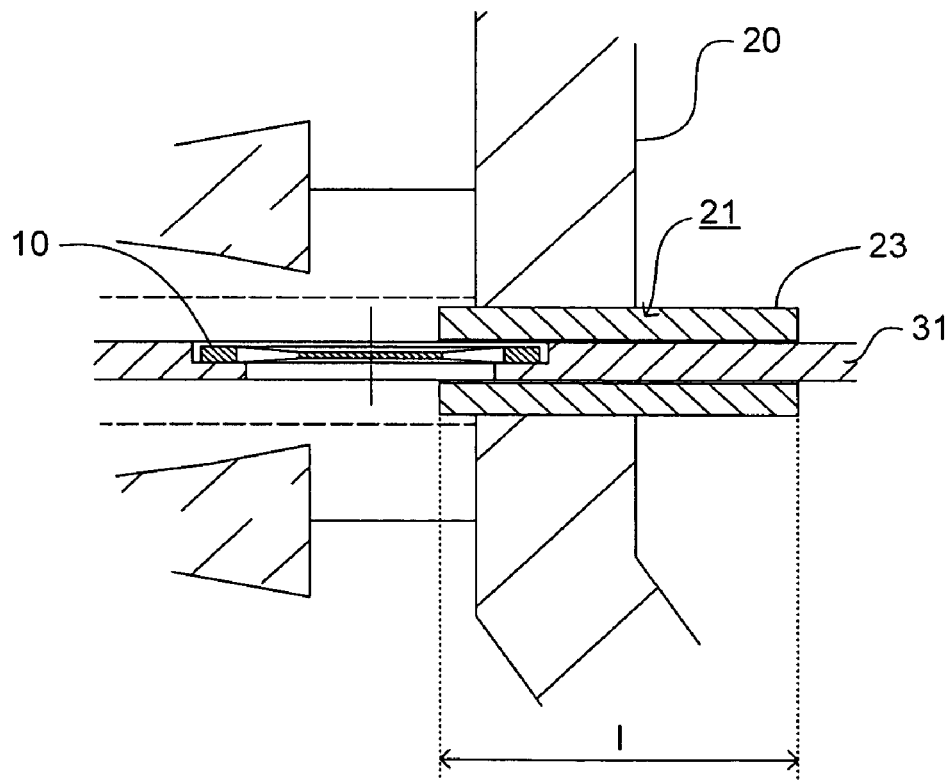
FIG. 4 is an enlarged view of part of FIG. 3 showing the enlarged optical element partially withdrawn.

Looking first at FIG. 3 and FIG. 4, which is an enlarged view of a portion of FIG. 3, it will be seen that the transport mechanism 30 includes a slider 31 having a recess 35 in which is mounted the exchangeable optical element 10. Slider 31 projects through an aperture 21 in the walls 22 of the housing 20 of the projection system PS so that, by insertion or withdrawal of the slider 31, the exchangeable optical element 10 can be positioned in, or withdrawn from, the path of the projected beam of radiation in the projection system.

Figure 5:
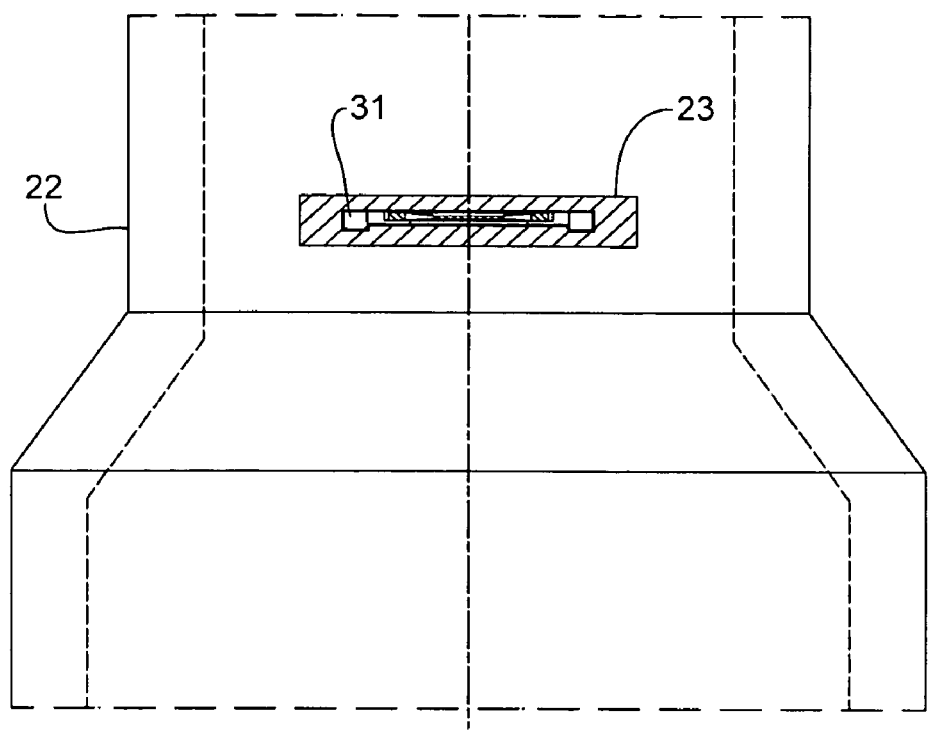
FIG. 5 is a front view of part of the projection system of the apparatus of FIG. 1 corresponding to FIG. 3.
Figure 6:
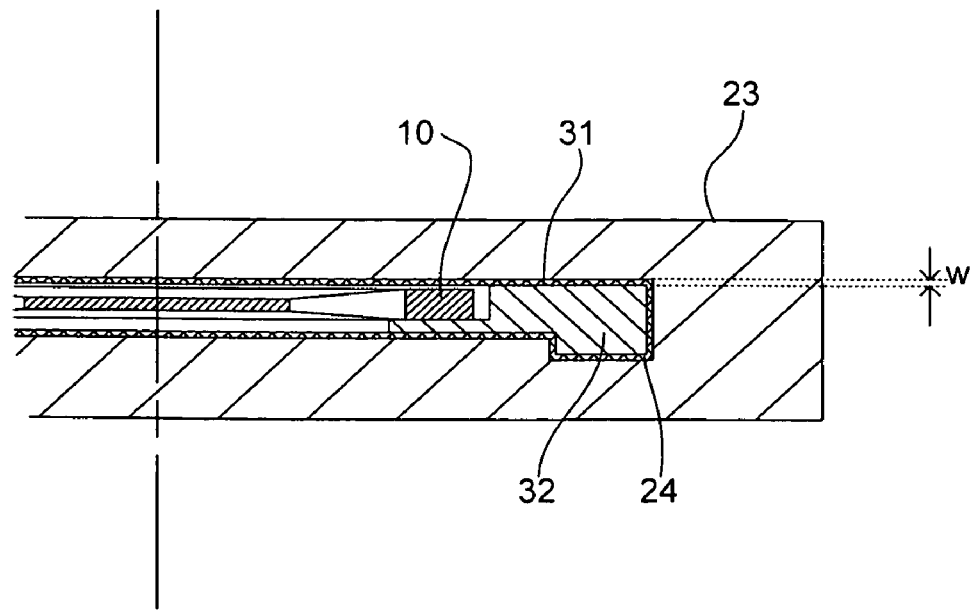
FIG. 6 is an enlarged view of part of FIG. 5.

FIGS. 4, 5 and 6 show in more detail that the aperture 21 is defined by lip piece 23 that projects outwardly of the walls 22 and closely surrounds the slider 31. Note that in FIG. 4 the slider 31 is shown partially withdrawn. To minimize leakage of flushing gas from the housing 22, the aperture defined by the lip piece 23 very closely conforms to the shape of the slider 31 and is quite long. The length l and height w of the gap are determined to provide a flow resistance sufficient to reduce gas leakage to an acceptable level, which may depend on the overpressure of the housing and the cost of the flushing gas, and also to ensure an outward gas flow rate fast enough to prevent ingress of contaminants, such as $O_2$, $H_2O$ and HC. The length may be in the range of about 50 to 500 mm, preferably about 200 to 500 mm, and the width in the range of about 0.05 to 0.2 mm, preferably about 0.075 to 0.15 mm. The resultant "seal" is leaky, but contactless so is not itself a source of contamination.

It will be seen that the lateral side portions 32 of the slider 31 have a greater height than the medial portion. This provides additional longitudinal stiffness for the slider and additional space 24 for bearings while allowing the aperture in the housing for the projection lens to be kept as small as possible, and ensuring that the pupil filter can fit in a narrow gap between lens elements. It is desirable that the slider be very stiff in order to avoid the need to enlarge the aperture 21 to accommodate deflections in the slider 31.

The slider is supported by the lip piece 23, which is connected to the housing 20. Since the slider will be stationary during exposures there is no transmission of vibrations to the projection system. However, it is desirable that there is no physical contact between the slider and the lip piece so as to prevent the creation of contaminant particles as might occur when two objects rub against one another.

A convenient way to support the slider 31 is by using gas-bearings (not shown in FIGS. 3 to 8), which can provide a very low-friction support. Gas bearings may be provided within or as an extension of the lip piece 23. If gas-bearings are used close to the aperture 21 it is convenient to use the same gas as is used to flush housing 20 and this has the additional benefit of reducing the risk of contamination of the projection system.

Figure 7:
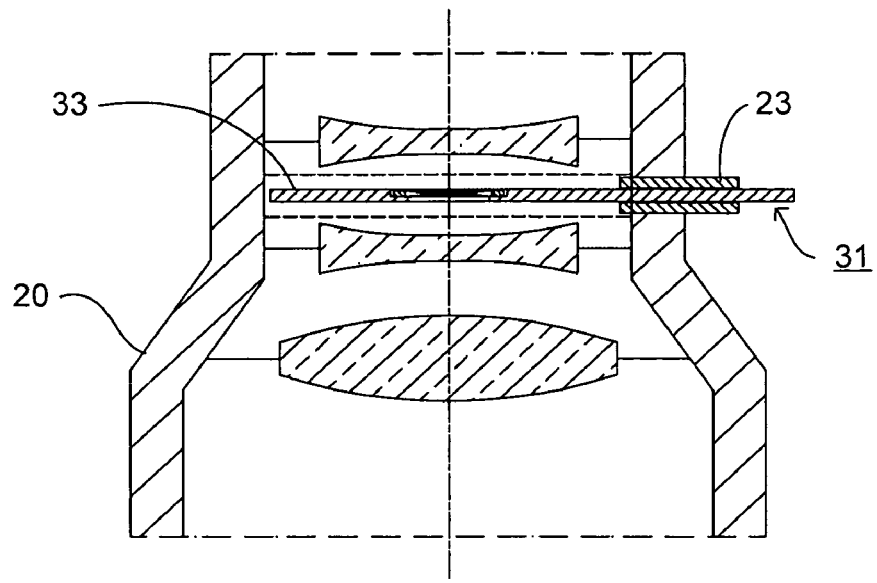
FIGS. 7 and 8 are views corresponding to FIG. 3 but showing the exchangeable optical element in fully inserted and fully withdrawn positions.
Figure 8:
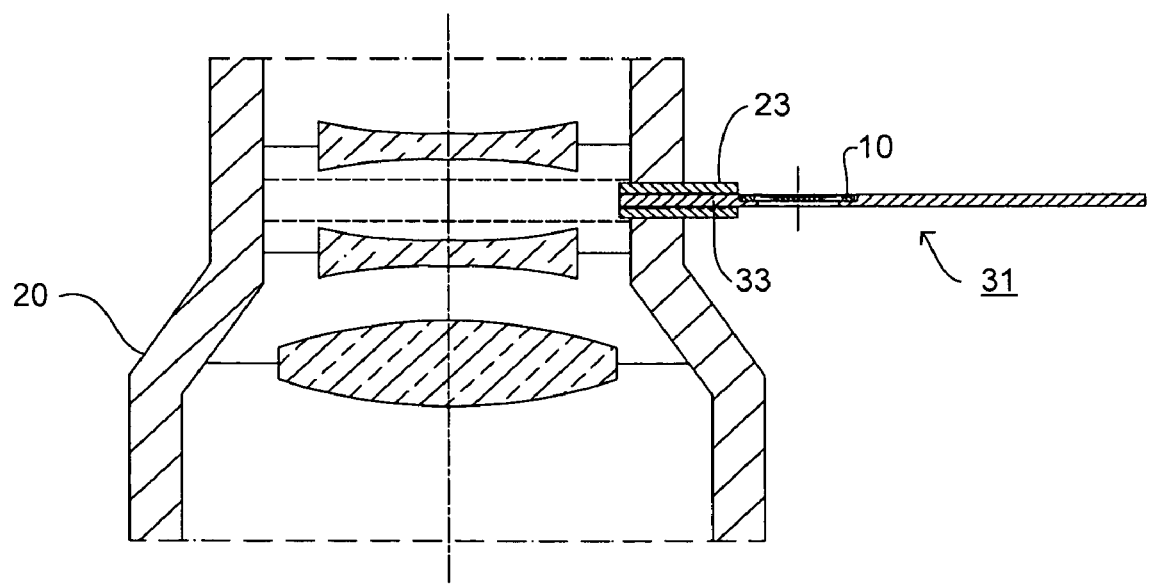

FIGS. 7 and 8 show the slider 31 holding the exchangeable optical element 10 in fully inserted (FIG. 7) and fully withdrawn (FIG. 8) positions. It will be seen that in the fully withdrawn position the exchangeable element 10 is in a position where it can be removed from the slider and replaced with another element, e.g. for use with a different pattern or different illumination settings. However, the distal portion 33 of the slider 31 remains within the lip piece 23 so as to maintain the effective seal of the housing 20.

Actuators for the slider 31 are not shown in FIGS. 3 to 8, however any suitable actuator having the desirable range of movement and power, such as linear motors, voice coil motors, belt drives or pneumatic actuators may be used. Since the projection system is sensitive to vibration and temperature changes, it is desirable to use an actuator which does not induce vibrations and has relatively low heat-dissipation, such as those mentioned. The actuators may be located outside the clean environment, with motion fed through using an appropriate mechanism.

It will be noted that the exchangeable element 10 remains in the slider 31 when inside the projection system; exchange of elements occurs outside the projection system when the slider is in the fully withdrawn position. This avoids the need to provide mechanisms inside the projection system, so avoiding contamination possibilities. An exchange mechanism according to an embodiment of the invention is described below.

Figure 9:
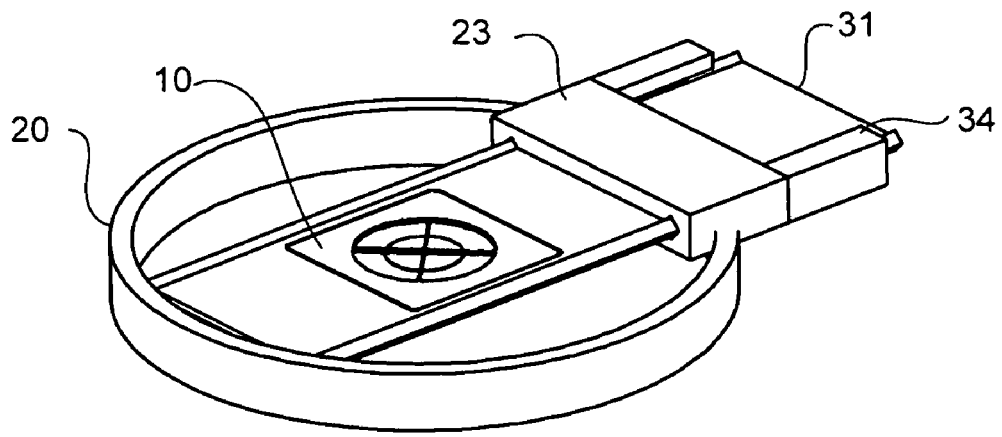
FIGS. 9 and 10 are perspective views of a variant form of the transform mechanism according to an embodiment of the invention.
Figure 10:
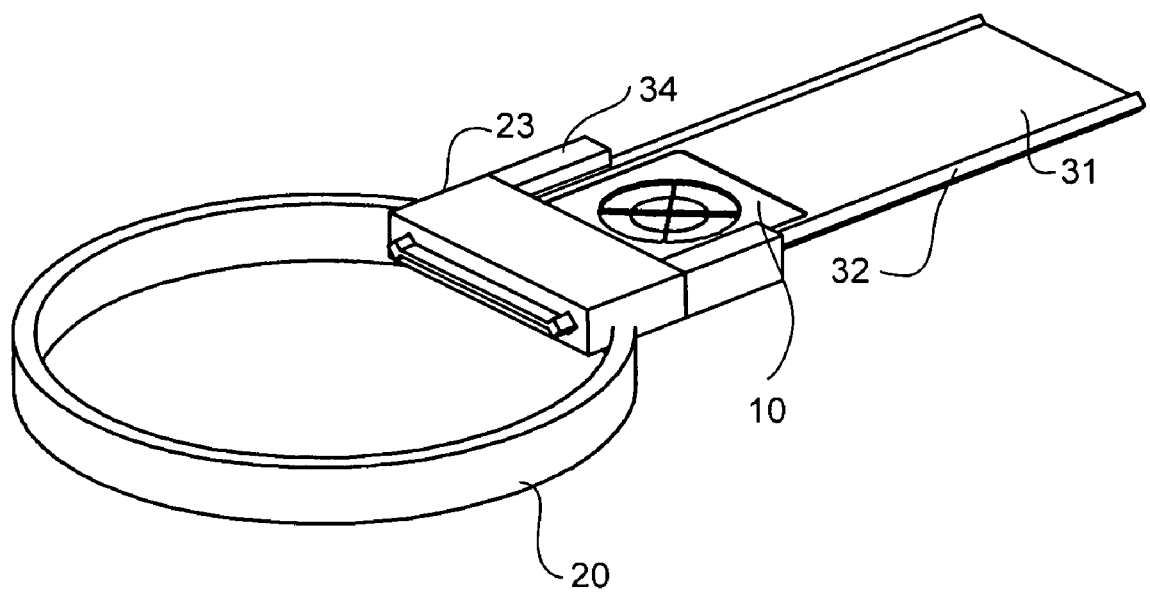

FIGS. 9 and 10 show a variant of the above described embodiment, in inserted and withdrawn positions respectively. An actuator and bearing unit 34, which may include gas bearings or roller bearings, for example, is shown adjacent to the lip piece 23, but preferably does not contact it to avoid transmission of heat and/or vibrations to the projection system.

As an alternative to the slider and leaky seal arrangement, it would be possible to provide an air-lock arrangement with separate doors to the clean interior of the housing 20 and the outside world. A mechanism, such as a gripper, within the air lock would receive an optical element through the outer door, which would then be closed. The inner door would open and the mechanism would position the optical element in the pupil plane. A flushing process may take place between closing of the outer door and opening of the inner door.

Figure 11:
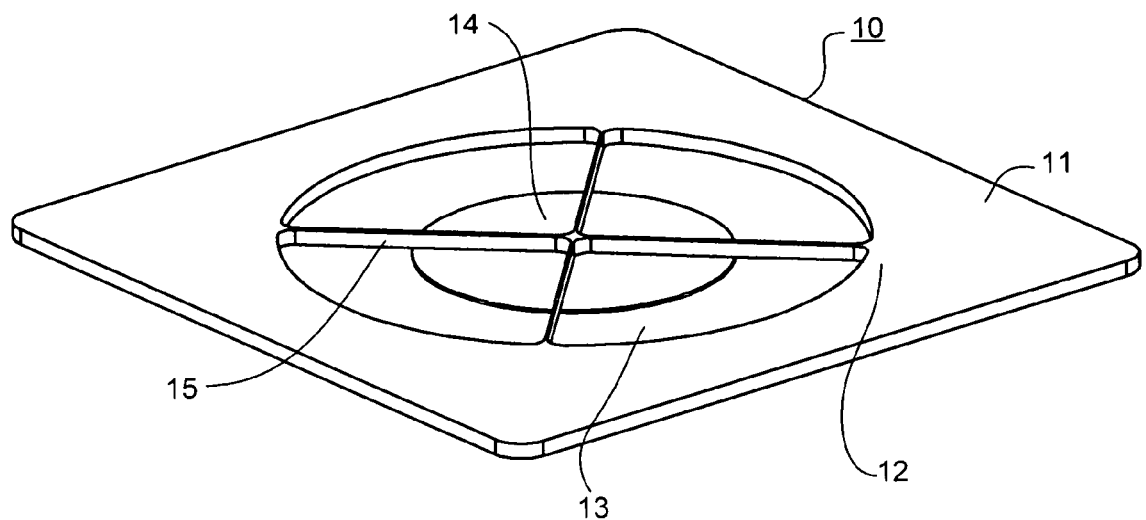
FIGS. 11 and 12 are respectively perspective and plan views of exchangeable optical element according to an embodiment of the invention.
Figure 12:
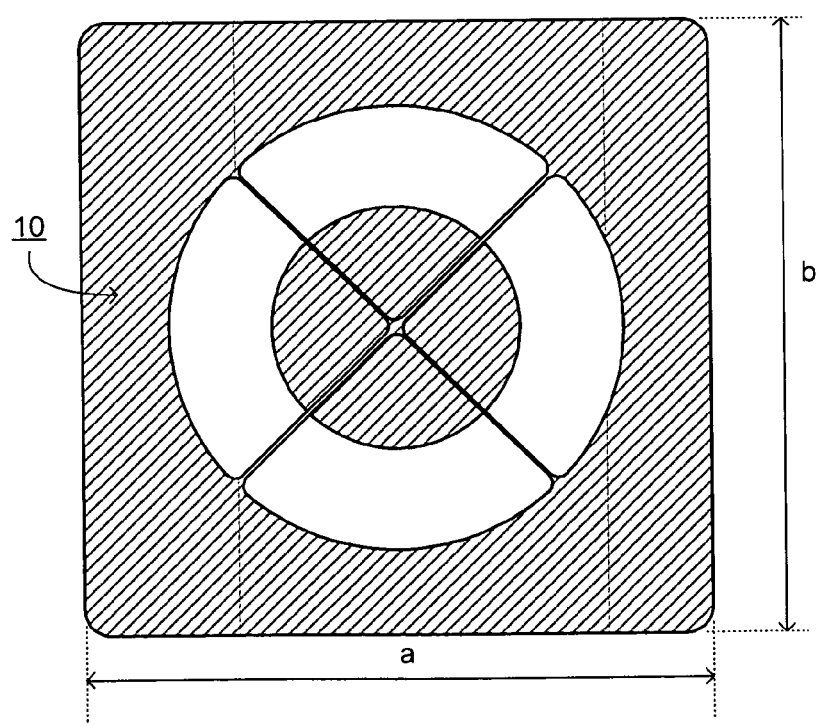

An exchangeable optical element 10 according to an embodiment of the invention is shown in FIGS. 11 and 12. The element 10 includes a frame 11, which is square with its sides a and b having a length equal to those specified in a standard for masks (reticles), for example substantially equal to 5, 6 or 9 inches (127, 152.4 or 228.6 mm). A relevant standard is SEMI standard P1-83 (available from www.semi.org) which allows nominally 5 inch reticles to have sides in the range of from 4.97 inches (126.24 mm) to 5 inches (127 mm). In an embodiment, the thickness of the frame also matches those specified in the same standard, e.g. about 0.09 inches (2.29 mm) or about 0.12 inches (3.05 mm), though deviations from the standard thickness are possible without loss of the benefits obtained by having the sides equal to those specified by the standard. In particular, the pupil filter may meet the standard at the edges to enable it to be accommodated in a standard SMIF box but may be thicker in the middle. The width of the frame is preferably sufficient to allow it to be gripped by a standard reticle handling device but the frame should not be so wide that the central area within it is smaller than the pupil plane of the projection system with which it is to be used. The frame may also be provided with human-readable markings and machine-readable markings (e.g. barcodes) in standard positions as specified for reticles in an industry or proprietary standard.

Within the frame, the optical element itself is mounted. In the illustrated embodiment this includes a binary pupil filter formed by a metal (e.g. aluminum) sheet 12 having an annular aperture 13. Ribs 15, also of metal, preferably aluminum, support the center piece 14. The sheet 12, ribs 15 and center piece 14 may all be provided with an anti-reflective coating effective at the wavelength of the exposure radiation to be used. The pupil filter may be monolithic, i.e. formed of a single piece of material, or may be a frame of standard form with an insert that can be easily formed to the desired shape.

The effect of the illustrated filter, when placed in the pupil plane of a projection system, is to obscure the central zeroth order of diffracted radiation whilst allowing at least one higher order to pass, which increases the contrast in the projected image, especially when imaging contact holes. To effect this correctly, the inner and outer radii of the annular aperture are preferably determined for a given pattern to be imaged and/or for given illumination settings, in an embodiment. Appropriate values can be determined by simulation or experiment.

Other forms of binary filter can be made by providing appropriate apertures in a metal sheet and supporting ribs. Filters may also be formed by providing locally opaque layers on a transparent substrate, e.g. chrome on quartz, and/or by varying the thickness of a transparent substrate to effect a phase correction.

A non-rotationally symmetric pupil filter can be used to correct imaging asymmetries such as horizontal and vertical (HV) CD offsets. By appropriate design of the pupil filter the effect can be tunable as a function of pitch. An elliptical filter can be used to expose features such as contact holes to enable the amount of biasing on the mask to be reduced. This allows more chrome to be left between eth holes whilst at the same time producing less elliptical contact holes, reducing the cost of the mask and also improving resolution. Other non-rotationally symmetric pupil filters can be used to filter selected diffraction orders in particular directions.

Rotationally symmetric pupil filters can also be used to improve machine to machine proximity matching and to provide NA values smaller than otherwise achievable.

Figure 13:
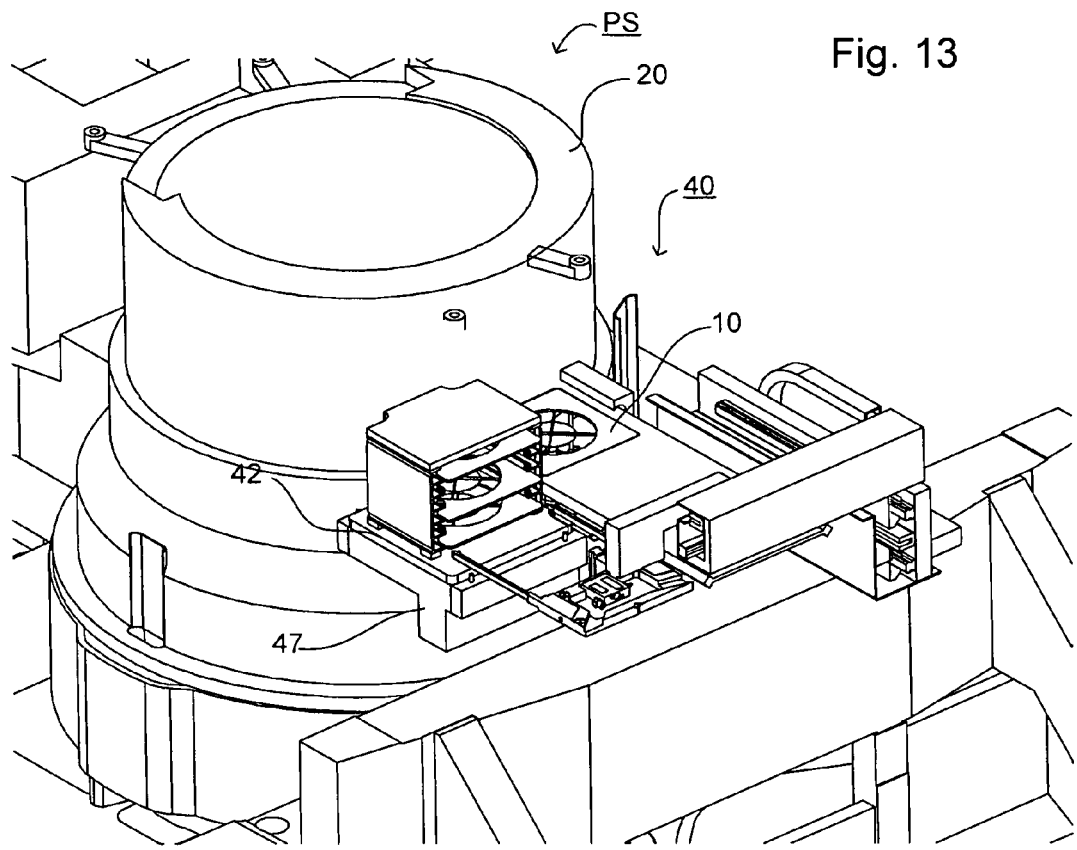
FIG. 13 is a perspective view showing a buffer and exchange mechanism for exchangeable optical elements in an embodiment of the invention.
Figure 14:
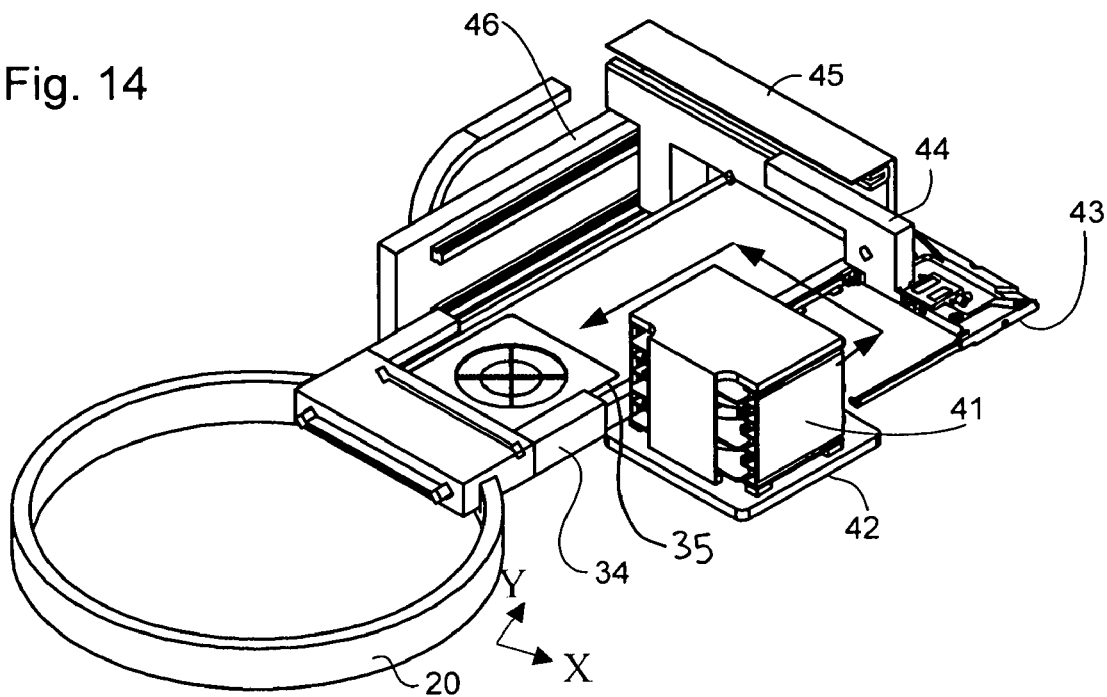
FIGS. 14 and 15 are enlarged views of part of the exchange mechanism of FIG. 13 showing movement of a gripper.
Figure 15:
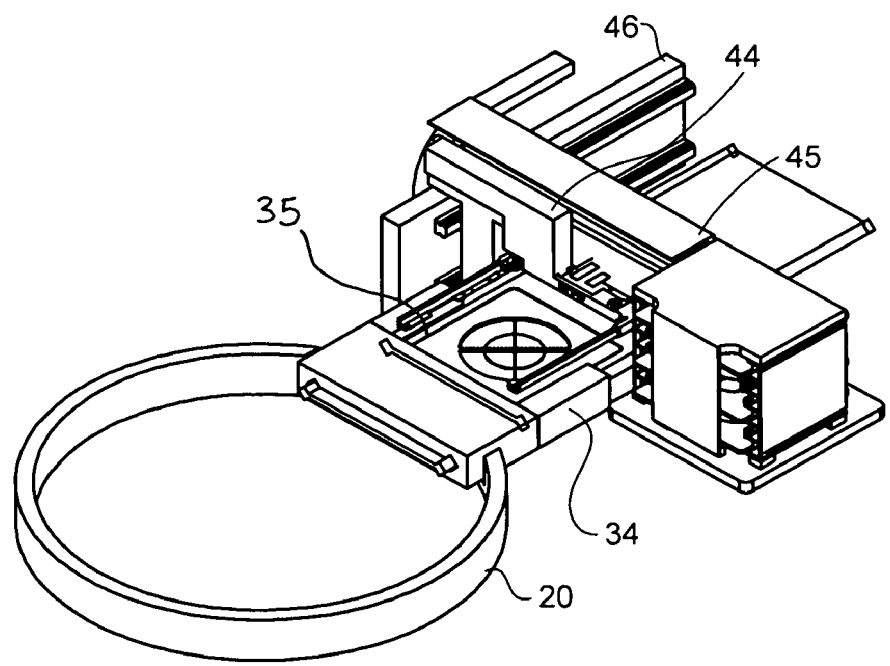

FIGS. 13 to 15 illustrate an exchange mechanism 40, according to an embodiment of the invention, for mounting and demounting exchangeable optical elements to the slider 31. As can be seen in FIG. 13, the exchange mechanism 40 is provided adjacent the projection system PS but is preferably thermally and mechanically isolated from it and any metrology or reference frame in the apparatus, in an embodiment.

Exchangeable optical elements are stored in a transport box 41, which preferably conforms to the Standard Mechanical InterFace (SMIF) standard for reticle storage and transport containers in an embodiment. Such a container can be mounted and demounted to the elevator platform 42 manually or by known automated handling devices. To move the exchangeable optical elements between the slider 31 and container 41 a gripper 43 of known type is used. This is mounted by arm 44 onto an X-drive 45 which in turn is mounted to a Y-drive 46. The gripper may therefore be moved in two directions to remove an exchangeable optical element 10 from container 41 and place it in recess 35 in slider 31 and vice versa as shown in FIGS. 14 and 15. The arm 44 may be equipped with actuators to effect any desirable movement in the Z-direction (perpendicular to X and Y) to pickup and release the element into the recess. The elevator platform 42 is moved vertically by a known mechanism 47 to present the optical element, or an empty slot, to the gripper 43.

Container 41 acts as a local buffer for optical elements that are used for lots to be processed by the apparatus. Since in many cases each optical element 10 will be optimized for a particular mask pattern, it is desirable to have a buffer in the apparatus with the same storage capacity as the corresponding mask buffer. In that case, the operator can load a set of masks and the corresponding optical elements at the same time. It is also desirable that the exchange of optical elements be performed in synchronism with and in the same time as the mask exchange.

Figure 16:
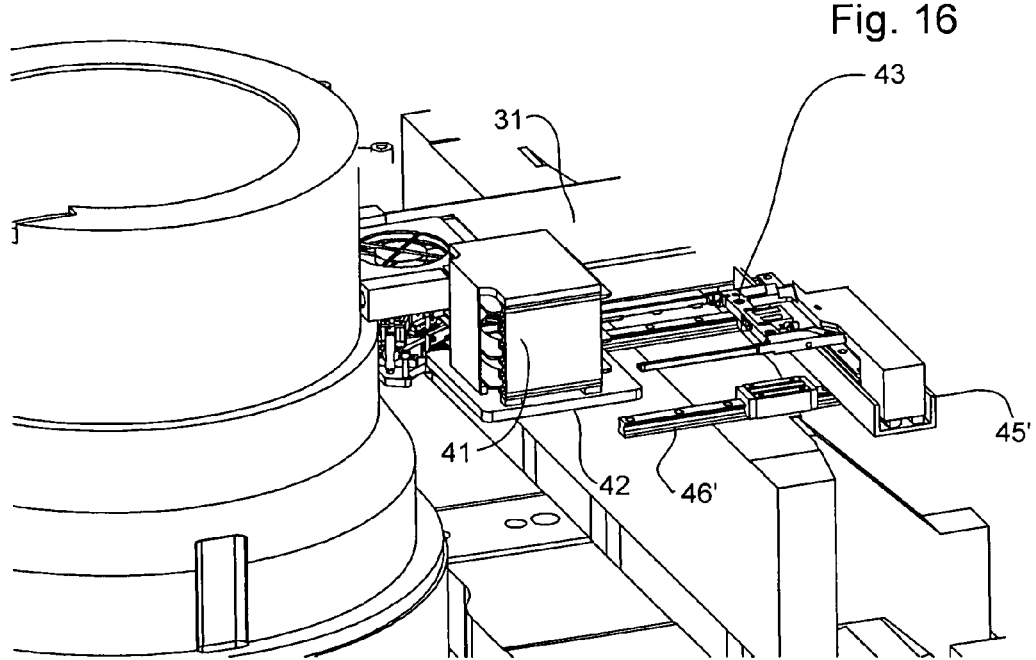
FIG. 16 is a perspective view of an alternative storage and exchange mechanism according to a further embodiment of the invention.

A modified exchange mechanism designed to fit in a smaller space is shown in FIG. 16. Most of this exchange mechanism is the same as that shown in FIGS. 13 to 15 but the X-drive 45' and Y-drive 46' are modified to fit in a smaller volume and the arm 44 is dispensed with.

Figure 17:
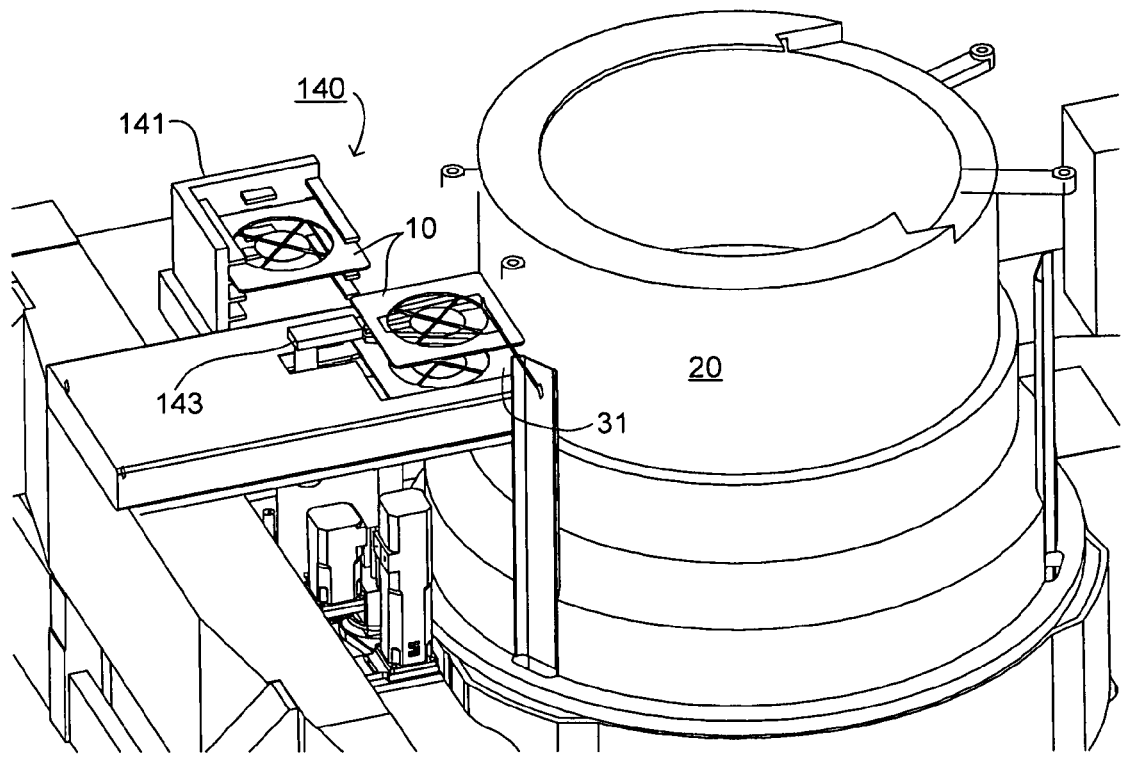
FIG. 17 is a perspective view of an alternative storage and exchange mechanism according to a further embodiment of the invention.

A further alternative exchange mechanism 140 is illustrated in FIG. 17. In stead of a SMIF box, this embodiment uses a rack 141 open on two sides to store pupil filters and act as a buffer. The number of slots provided in the rack 141 depends on the available height but may be 4 or 5, for example. A gripper 143 is movable in two degrees of freedom—Z and Rz—to transfer pupil filters from the slider 31, when in the exchange position, and storage rack 141. It is initially positioned under the pupil filter in the slider, lifts the pupil filter up out of the slider the rotates to position the pupil filter in the rack 141 and finally lowers to place the pupil filter on supports in the rack 141. An additional cut out may be provided in the slider to accommodate this movement. Actuators for the gripper 143 may be located outside the clean environment and fed through via bellows, leaky seals of differential gas bearings. The gripper may be passive, simply lifting up the pupil filters rather than including any active gripping mechanism such as a vacuum clamp or electromagnets. The rack 141 can use a mechanism, such as balls in v-grooves to precisely locate the pupil filters, allowing precise placement in the slider.

In any of the above described transport system, and additional pupil filter handling device or gripper may be provided above the position where the pupil filter emerges from housing 20. During an exchange of pupil filters, the additional gripper removes the "old" pupil filter from the slider as soon as it emerges from the housing 20, allowing the "new" pupil filter, which has been removed from storage in advance by gripper 43, to be placed directly onto the slider 31. This minimizes the time take for pupil filter exchange as return of the "old" pupil filter to storage and pre-selection of the "new" pupil filter can both be done in parallel with exposures.

In a further alternative, not illustrated, which is particularly useful in embodiments in which the exchangeable optical elements are the same size as the masks, the masks and the exchangeable optical elements may be stored together, e.g. in the same or adjacent containers such as SMIF boxes, and a common handling system used to transport the masks to the mask stage and the exchangeable optical element to the transport mechanism.

Figure 18:
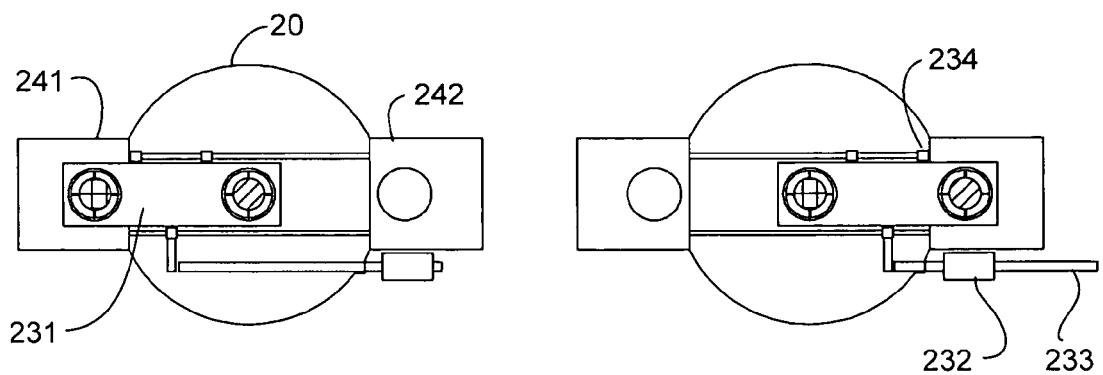
FIG. 18 is a perspective view of an alternative slider arrangement according to an embodiment of the invention.

In an apparatus having a mask stage capable of holding two masks, which is beneficial as it enables more rapid performance of double-exposures, it is desirable to have a slider capable of receiving two exchangeable optical elements so they can be swapped between as fast as the masks. Such an arrangement is shown in FIG. 18. In this embodiment, two load/unload positions 241, 242 for pupil filters, and corresponding transport mechanisms, are provided—one either side of the projection system PS. The drive mechanism 232 for the slider 231 includes a rod 233 passing through an aperture in the housing 20 and bearings 234 for the slider 231.

The whole of the transport and exchange mechanisms may be contained in a closed compartment which is purged with clean and pure $N_2$ to prevent contamination of the exchangeable optical element, which could be transported into the projection system.

If the projection system has multiple pupil planes, exchangeable optical elements may be provided in any or all pupil planes as desired and convenient. In an embodiment of the invention it has been found that the pupil plane closest to the pattern being imaged is most convenient as it has a size comparable to the pattern.

It will be appreciated that the above described transport mechanism could be used in other embodiments of the invention to exchange any types of optical elements in the projection system. For example, the transport mechanism could be used in an embodiment to exchange a lens, a mirror or an optical element including a combination of various types of optical components, including refractive, reflective, magnetic, electromagnetic and electrostatic optical components.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic projection apparatus comprising:
   a projection system arranged to project an image of a pattern onto a substrate, the projection system comprising a plurality of optical elements that form an optical system configured to project a beam of radiation along an optical path including a pupil plane, and
   a transport mechanism arranged to move an exchangeable optical element that has peripheral dimensions that substantially match relevant parts of a standard for patterning devices into and out of the optical path in the pupil plane of the optical system,
   wherein the transport mechanism includes a holder configured to hold the exchangeable optical element during projection of the beam of radiation and a bearing unit configured to support the holder, said bearing unit being configured to support the holder when the exchangeable optical element is held by the holder inside the projection system during projection of the beam of radiation and when the exchangeable optical element is held by the holder outside the projection system.

2. An apparatus according to claim 1, wherein the exchangeable optical element comprises a filter.

3. An apparatus according to claim 2, wherein the filter comprises an opaque region.

4. An apparatus according to claim 3, wherein the opaque region is located so as to obscure the zeroth order of light diffracted by the pattern.

5. An apparatus according to claim 2, wherein the filter is a binary filter.

6. An apparatus according to claim 2, wherein the filter is a grayscale filter.

7. An apparatus according to claim 2, wherein the filter is not rotationally symmetric.

8. An apparatus according to claim 1, wherein the transport mechanism is arranged to transport an exchangeable optical element that is substantially square in plan and has sides substantially equal to 5, 6 or 9 inches (127, 152.4 or 228.6 mm).

9. An apparatus according to claim 1, further comprising a mask table adapted to hold a patterning device having predetermined dimensions and wherein the transport mechanism is arranged to transport an exchangeable optical element that has dimensions substantially equal to the predetermined dimensions.

10. An apparatus according to claim 1, wherein the transport mechanism is adapted to transport the exchangeable optical element between the pupil plane and a storage unit that is adapted to hold a plurality of exchangeable optical elements.

11. An apparatus according to claim 10, further comprising a mounting device adapted to hold a container that conforms to a Standard Mechanical InterFace (SMIF) standard and that acts as the storage unit.

12. An apparatus according to claim 1, wherein the projection system comprises a housing surrounding the optical elements and a gas supply system arranged to supply gas to the housing at a pressure greater than that of the atmosphere around the housing.

13. An apparatus according to claim 12, wherein the housing has a slot therein and the holder comprises a slider arranged to hold the exchangeable optical element and the transport mechanism includes an actuator arranged to translate the slider between a first position in which the exchangeable optical element is located in the pupil plane and a second position in which the exchangeable optical element is outside the housing.

14. An apparatus according to claim 13, wherein the slider has a cross-section that closely matches a shape of the slot in the housing such that gas leakage through the slot is minimized.

15. An apparatus according to claim 13, further comprising a gas bearing arranged to support the slider, the gas bearing being supplied with gas from the same gas supply system as the housing.

16. An apparatus according to claim 12, wherein the exchangeable optical element and the transport mechanism do not contact the housing or any of the optical elements of the projection system.

17. An apparatus according to claim 1, wherein the transport mechanism includes a slider arranged to hold the exchangeable optical element, the slider being constructed and arranged to move into the projection system to position the exchangeable optical element in the optical path.

18. An apparatus according to claim 17, wherein the slider is constructed and arranged to hold the exchangeable optical element during projection of the beam of radiation.

19. An apparatus according to claim 1, wherein at least part of the transport mechanism is located in the projection system during projection of the beam of radiation.

20. An apparatus according to claim 1, wherein the bearing unit is formed in a housing of the projection system.

21. An apparatus according to claim 1, wherein the bearing unit includes a gas bearing.

22. An apparatus according to claim 1, wherein the holder remains coupled to the bearing unit during exchange of the exchangeable optical element outside the projection system.

23. A device manufacturing method using a lithographic projection apparatus that includes a pattern support to support a patterning device and a projection system having a pupil plane and arranged to project an image of a pattern of the patterning device onto a substrate, the method comprising:
   loading the patterning device onto the pattern support;
   positioning an exchangeable optical element in the pupil plane using a transport mechanism, the transport mechanism including a holder configured to hold the exchangeable optical element during projection of the beam of radiation and a bearing unit configured to support the holder;

projecting an image of the pattern onto the substrate;

holding the exchangeable optical element using the holder during the projecting;

removing the patterning device from the pattern support; and removing the exchangeable optical element from the pupil planes wherein the exchangeable optical element has peripheral dimensions that substantially match relevant parts of a standard for patterning devices, and wherein said bearing unit is configured to support the holder when the exchangeable optical element is held by the holder inside the projection system during projection of the beam of radiation and when the exchangeable optical element is held by the holder outside the projection system.

24. A method according to claim 23, further comprising repeating the projecting to project the image a plurality of times onto one or more substrates.

25. A method according to claim 23 further comprising:
loading a second patterning device onto the pattern support, the second patterning device including a second pattern;
positioning a second exchangeable optical element in the pupil plane;
projecting an image of the second pattern onto a substrate;
removing the second patterning device from the patterning device; and
removing the second exchangeable optical element from the pupil plane.

26. A method according to claim 25, wherein projecting an image of the second pattern is performed onto the same substrate as the projecting of the pattern.

27. A method according to claim 25, wherein the transport mechanism includes a slider arranged to hold the exchangeable optical element, the slider being constructed and arranged to move into the projection system to position the exchangeable optical element in an optical path of the projection system.

28. A method according to claim 27, wherein the slider is constructed and arranged to hold the exchangeable optical element during the projecting.

29. A method according to claim 25, wherein at least part of the transport mechanism is located in the projection system during the projecting.

30. A method according to claim 23, wherein the bearing unit is formed in a housing of the projection system.

31. A method according to claim 23, wherein the bearing unit includes a gas bearing.

32. A method according to claim 23, wherein the holder remains coupled to the bearing unit during exchange of the exchangeable optical element outside the projection system.

33. A device manufacturing method using a lithographic projection apparatus that includes a pattern support to support a patterning device and a projection system having a pupil plane and arranged to project an image of a pattern of the patterning device onto a substrate, the method comprising:
loading the patterning device onto the pattern support;
positioning an exchangeable optical element in the pupil plane;
projecting an image of the pattern onto the substrate;
removing the patterning device from the pattern support; and
removing the exchangeable optical element from the pupil plane
wherein the exchangeable optical element has peripheral dimensions that substantially match relevant parts of a standard for patterning devices, and
wherein the loading and positioning are carried out substantially at the same time.

34. A device manufacturing method using a lithographic projection apparatus that includes a pattern support to support a patterning device and a projection system having a pupil plane and arranged to project an image of a pattern of the patterning device onto a substrate, the method comprising:
loading the patterning device onto the pattern support;
positioning an exchangeable optical element in the pupil plane;
projecting an image of the pattern onto the substrate;
removing the patterning device from the pattern support; and
removing the exchangeable optical element from the pupil plane
wherein the exchangeable optical element has peripheral dimensions that substantially match relevant parts of a standard for patterning devices, and
wherein removing the patterning device and removing the exchangeable optical element are carried out substantially at the same time.

* * * * *